(12) United States Patent
Hanafi

(10) Patent No.: US 7,435,636 B1
(45) Date of Patent: Oct. 14, 2008

(54) FABRICATION OF SELF-ALIGNED GALLIUM ARSENIDE MOSFETS USING DAMASCENE GATE METHODS

(75) Inventor: Hussein I. Hanafi, Basking Ridge, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/693,380

(22) Filed: Mar. 29, 2007

(51) Int. Cl.
*H01L 21/338* (2006.01)

(52) U.S. Cl. .................. 438/183; 438/303; 438/306; 438/E2.441; 438/E29.158

(58) Field of Classification Search .................. 438/83, 438/303–306; 257/E29.258, E21.441
See application file for complete search history.

(56) References Cited

U.S. PATENT DOCUMENTS

| | | | |
|---|---|---|---|
| 5,966,597 A | 10/1999 | Wright | |
| 6,034,882 A | 3/2000 | Johnson et al. | |
| 6,063,699 A | 5/2000 | Hanafi et al. | |
| 6,103,559 A | 8/2000 | Gardner et al. | |
| 6,162,688 A | 12/2000 | Gardner et al. | |
| 6,185,122 B1 | 2/2001 | Johnson et al. | |
| 6,194,748 B1 | 2/2001 | Yu | |
| 6,236,094 B1 | 5/2001 | Wright | |
| 6,245,619 B1 | 6/2001 | Boyd et al. | |
| 6,258,679 B1 | 7/2001 | Burns et al. | |
| 6,271,094 B1 | 8/2001 | Boyd et al. | |
| 6,271,095 B1 | 8/2001 | Yu | |
| 6,288,422 B1 | 9/2001 | Mandelman et al. | |
| 6,351,406 B1 | 2/2002 | Johnson et al. | |
| 6,353,249 B1 | 3/2002 | Boyd et al. | |
| 6,440,808 B1 | 8/2002 | Boyd et al. | |
| 6,451,639 B1 * | 9/2002 | Jang et al. ............... 438/183 |
| 6,461,529 B1 | 10/2002 | Boyd et al. | |
| 6,483,736 B2 | 11/2002 | Johnson et al. | |
| 6,492,670 B1 | 12/2002 | Yu | |
| 6,525,953 B1 | 2/2003 | Johnson | |
| 6,531,410 B2 | 3/2003 | Bertin et al. | |
| 6,580,137 B2 | 6/2003 | Parke | |
| 6,635,923 B2 | 10/2003 | Hanafi et al. | |
| 6,656,824 B1 | 12/2003 | Hanafi et al. | |
| 6,660,598 B2 | 12/2003 | Hanafi et al. | |
| 6,686,630 B2 | 2/2004 | Hanafi et al. | |
| 6,780,683 B2 | 8/2004 | Johnson et al. | |
| 6,780,694 B2 | 8/2004 | Doris et al. | |
| 6,780,711 B2 | 8/2004 | Johnson et al. | |
| 6,835,614 B2 | 12/2004 | Hanafi et al. | |
| 6,841,831 B2 | 1/2005 | Hanafi et al. | |

(Continued)

*Primary Examiner*—Dung A. Le
(74) *Attorney, Agent, or Firm*—Dinsmore & Shohl LLP

(57) ABSTRACT

A method for fabricating a gallium arsenide MOSFET device is presented. A dummy gate is formed over a gallium arsenide substrate. Source-drain extensions are implanted into the substrate adjacent the dummy gate. Dummy spacers are formed along dummy gate sidewalls and over a portion of the source-drain extensions. Source-drain regions are implanted. Insulating spacers are formed on dummy oxide spacer sidewalls. A conductive layer is formed over the source-drain regions. The conductive layer is annealed to form contacts to the source-drain regions. The dummy gate and the dummy oxide spacers are removed to form a gate opening. A passivation layer is in-situ deposited in the gate opening. The surface of the passivation layer is oxidized to create an oxide layer. A dielectric layer is ex-situ deposited over the oxide layer. A gate metal is deposited over the dielectric layer to form a gate stack in the gate opening.

31 Claims, 13 Drawing Sheets

U.S. PATENT DOCUMENTS

| | | |
|---|---|---|
| 6,852,167 B2 | 2/2005 | Ahn |
| 6,916,694 B2 * | 7/2005 | Hanafi et al. .................. 438/166 |
| 7,056,773 B2 | 6/2006 | Bryant et al. |
| 7,157,314 B2 | 1/2007 | Subramanian et al. |
| 7,160,761 B2 | 1/2007 | Cleeves et al. |
| 2002/0018355 A1 | 2/2002 | Johnson et al. |
| 2002/0027793 A1 | 3/2002 | Johnson et al. |
| 2002/0028555 A1 | 3/2002 | Boyd et al. |
| 2002/0036347 A1 | 3/2002 | Houston |
| 2002/0105039 A1 | 8/2002 | Hanafi et al. |
| 2002/0119637 A1 | 8/2002 | Bertin et al. |
| 2002/0177263 A1 | 11/2002 | Hanafi et al. |
| 2002/0192911 A1 | 12/2002 | Parke |
| 2002/0197810 A1 | 12/2002 | Hanafi et al. |
| 2003/0016553 A1 | 1/2003 | Subramanian et al. |
| 2003/0026121 A1 | 2/2003 | Johnson et al. |
| 2003/0064572 A1 | 4/2003 | Johnson |
| 2003/0109090 A1 | 6/2003 | Bertin et al. |
| 2003/0124802 A1 | 7/2003 | Johnson et al. |
| 2003/0162358 A1 | 8/2003 | Hanafi et al. |
| 2003/0206429 A2 | 11/2003 | Subramanian et al. |
| 2003/0211681 A1 | 11/2003 | Hanafi et al. |
| 2004/0092067 A1 | 5/2004 | Hanafi et al. |
| 2004/0132236 A1 | 7/2004 | Doris et al. |
| 2005/0026334 A1 | 2/2005 | Knall |
| 2005/0045972 A1 | 3/2005 | Hanafi et al. |
| 2005/0063220 A1 | 3/2005 | Johnson |
| 2005/0105371 A1 | 5/2005 | Johnson et al. |
| 2005/0158935 A1 * | 7/2005 | Shin et al. .................... 438/197 |
| 2005/0167742 A1 | 8/2005 | Challa et al. |
| 2005/0170659 A1 | 8/2005 | Hanafi et al. |
| 2005/0196926 A1 | 9/2005 | Hanafi et al. |
| 2005/0245009 A1 | 11/2005 | Bryant et al. |
| 2006/0084232 A1 | 4/2006 | Grupp et al. |
| 2006/0091432 A1 * | 5/2006 | Guha et al. .................. 257/288 |
| 2006/0094182 A1 | 5/2006 | Hanafi et al. |
| 2006/0108320 A1 | 5/2006 | Lazovsky et al. |
| 2006/0131672 A1 | 6/2006 | Wang et al. |
| 2006/0131675 A1 | 6/2006 | Wang et al. |
| 2006/0134837 A1 | 6/2006 | Subramanian et al. |
| 2006/0141679 A1 | 6/2006 | Subramanian et al. |
| 2006/0145195 A1 | 7/2006 | Bryant et al. |
| 2006/0172497 A1 | 8/2006 | Hareland et al. |
| 2006/0189110 A1 | 8/2006 | Mandelman et al. |
| 2006/0214221 A1 | 9/2006 | Challa et al. |
| 2006/0214222 A1 | 9/2006 | Challa et al. |
| 2006/0237774 A1 | 10/2006 | Bryant et al. |

* cited by examiner

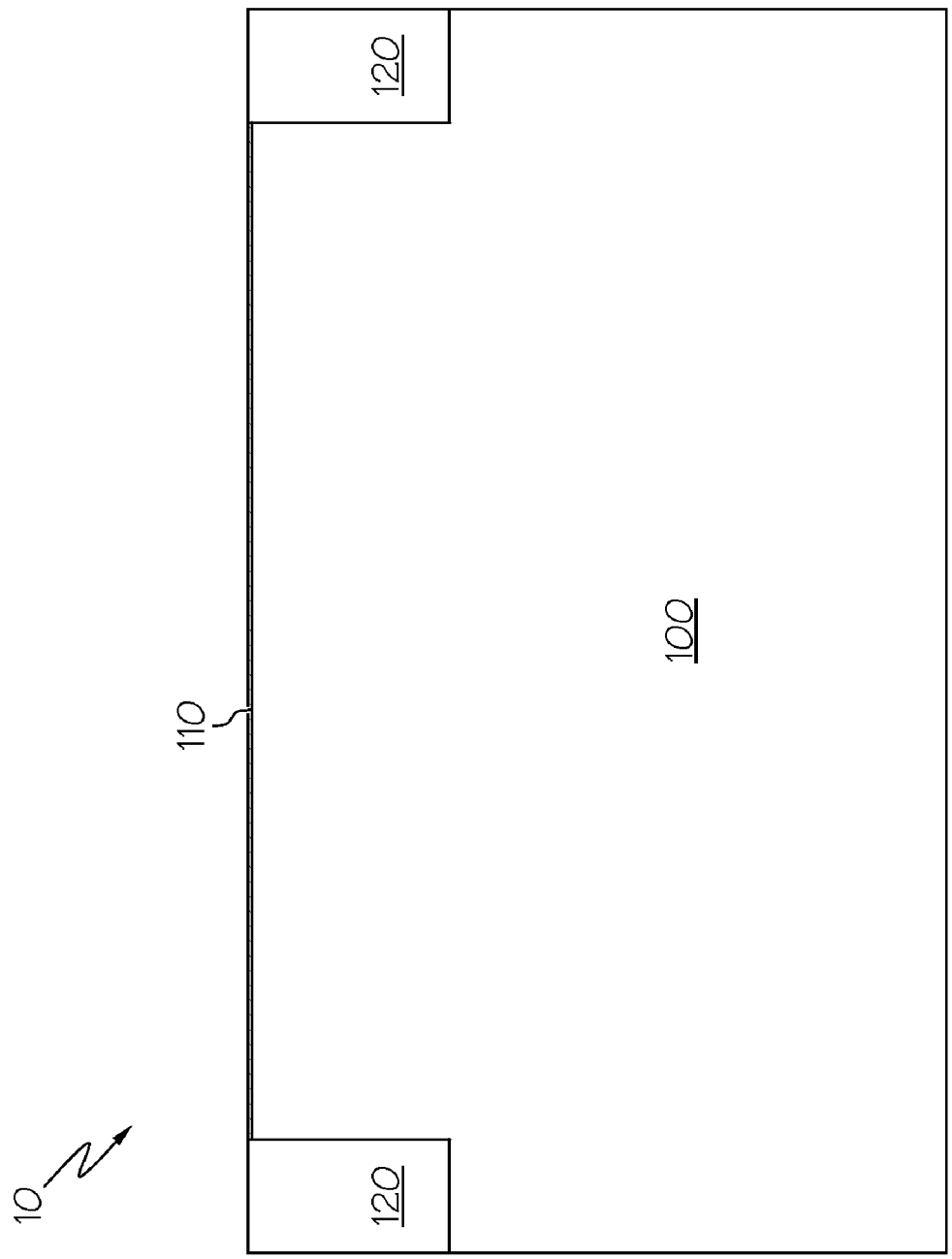

FABRICATION OF SELF-ALIGNED GALLIUM ARSENIDE MOSFETS USING DAMASCENE GATE METHODS

BACKGROUND OF THE INVENTION

The present invention relates to fabricating self-aligned metal oxide semiconductor field effect transistors (MOSFETS), and more particularly, to fabricating self-aligned, inversion mode gallium arsenide MOSFETS with excellent electrical characteristics.

The difficulty of increasing performance in sub-100 nm silicon (Si) complementary metal-oxide semiconductor (CMOS) technology has renewed interest in the use of Group III-V channel materials for advanced very large-scale integration (VLSI) CMOS. Gallium Arsenide (GaAs) is an attractive choice due to its relative maturity compared to other Group III-V compounds, its high electron mobility (~6× compared to Si), and its lattice matching with germanium (Ge). The main barrier towards implementing enhancement—or depletion—mode GaAs MOSFETs for VLSI application is the difficulty of forming a high-quality gate insulator that passivates the interface states and prevents Fermi level pinning at the GaAs surface. However, other problems also need to be overcome including poor thermal stability of the gate stack and the lack of a self-aligned contacting scheme.

Recently, GaAs n-channel metal-oxide semiconductor (NMOS) capacitors with an in-situ molecular beam epitaxy (MBE) grown amorphous silicon (α-Si) passivation layer and ex-situ physical vapor deposition (PVD) hafnium oxide ($HfO_2$) gate dielectric have shown excellent electrical characteristics. Interface state densities $D_{it}$ as low as $1\times10^{11}/cm^2.eV$ are obtained with excellent thermal stability of the $GaAs/\alpha\text{-}Si/SiO_2/HfO_2$. When self-aligned GaAs MOSFETs were fabricated using conventional metal-oxide semiconductor (MOS) processes, the devices exhibited poor electrical characteristics, namely large subthreshold slope and small on-off current ratio of $10^3$, a value that was limited by gate leakage current. The poor electrical characteristics and high gate leakage were attributed to $GaAs/\alpha\text{-}Si/SiO_2/HfO_2$ interface degradation caused by conventional high-temperature front end of the line MOS processes.

Therefore, there is a need for a method of fabricating a self-aligning, inversion mode GaAs MOSFET with excellent electrical characteristics.

BRIEF SUMMARY OF THE INVENTION

According to embodiments of the present invention, a process to fabricate self-aligned, inversion mode GaAs MOSFETS with excellent electric characteristics is presented. The process uses damascene gate methods enabling the deposition of the MOSFET gate stack after all the front-end-of-the-line (FEOL) hot processes are performed. In the damascene gate method, the $\alpha\text{-}Si/SiO_2/HfO_2$/metal gate stack is deposited in a groove formed by removing a dummy gate. As technologies scale to smaller dimensions, the gate length of the GaAs MOSFET gets shorter, hence the $\alpha\text{-}Si/SiO_2/HfO_2$ stack occupies an increasing fraction of the groove. In addition, the gate itself tends to be rounded at the bottom meaning that only the center of the gate has full control of the channel, and the presence of a gap between the source and drain (S/D) extension and the gate edge increases the on resistance of the MOSFET and degrades its performance. By using a dummy spacer formed along the sidewall of the dummy gate, the groove can be made much wider, for a given gate length, while also allowing the accurate placement of the S/D extension edges inside the groove to eliminate the gap between the S/D extension and the actual gate. The wider groove facilitates the introduction of the $\alpha\text{-}Si/SiO_2/HfO_2$/metal gate stack. Self-aligned source and drain regions are formed using $Si^+$ ion implantation. The contacts are formed by patterning a conductive metal alloy such as GeAuNiAu.

Accordingly, it is a feature of the embodiments of the present invention to provide a self-aligned source/drain contacting scheme.

Because the degradation of the $GaAs/\alpha\text{-}Si/SiO_2/HfO_2$ interface in the GaAs MOSFETs is caused by conventional MOS high temperature FEOL processing, it is another feature of the embodiments of the present invention to provide an integration scheme for GaAs MOSFETs using damascene gate methods where all high-temperature FEOL processes are carried out prior to gate stack deposition to improve GaAs MOSFET device characteristics. Other features of the embodiments of the present invention will be apparent in light of the description of the invention embodied herein.

BRIEF DESCRIPTION OF THE SEVERAL VIEWS OF THE DRAWINGS

The following detailed description of embodiments of the present invention can be best understood when read in conjunction with the following drawings, where like structure is indicated with like reference numerals and in which:

FIGS. 1a-m schematically illustrate the basic processing steps of the formation of a self-aligned Gallium Arsenide metal oxide semiconductor field effect transistor according to an embodiment of the present invention.

DETAILED DESCRIPTION

In the following detailed description of the embodiments, reference is made to the accompanying drawings that form a part hereof, and in which are shown by way of illustration, and not by way of limitation, specific embodiments in which the invention may be practiced. It is to be understood that other embodiments may be utilized and that logical, mechanical and electrical changes may be made without departing from the spirit and scope of the present invention.

Figure 1B:
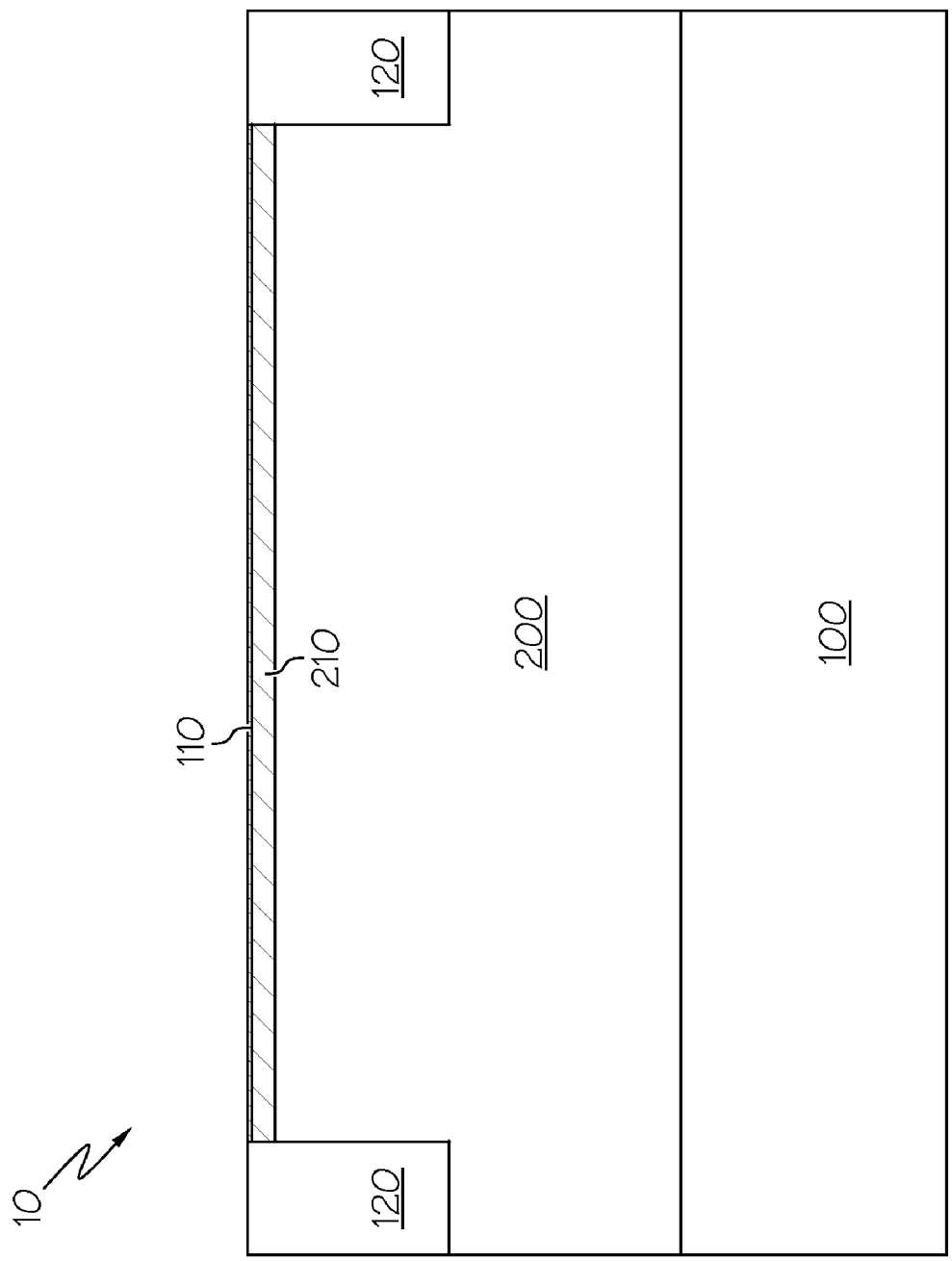
Figure 1C:
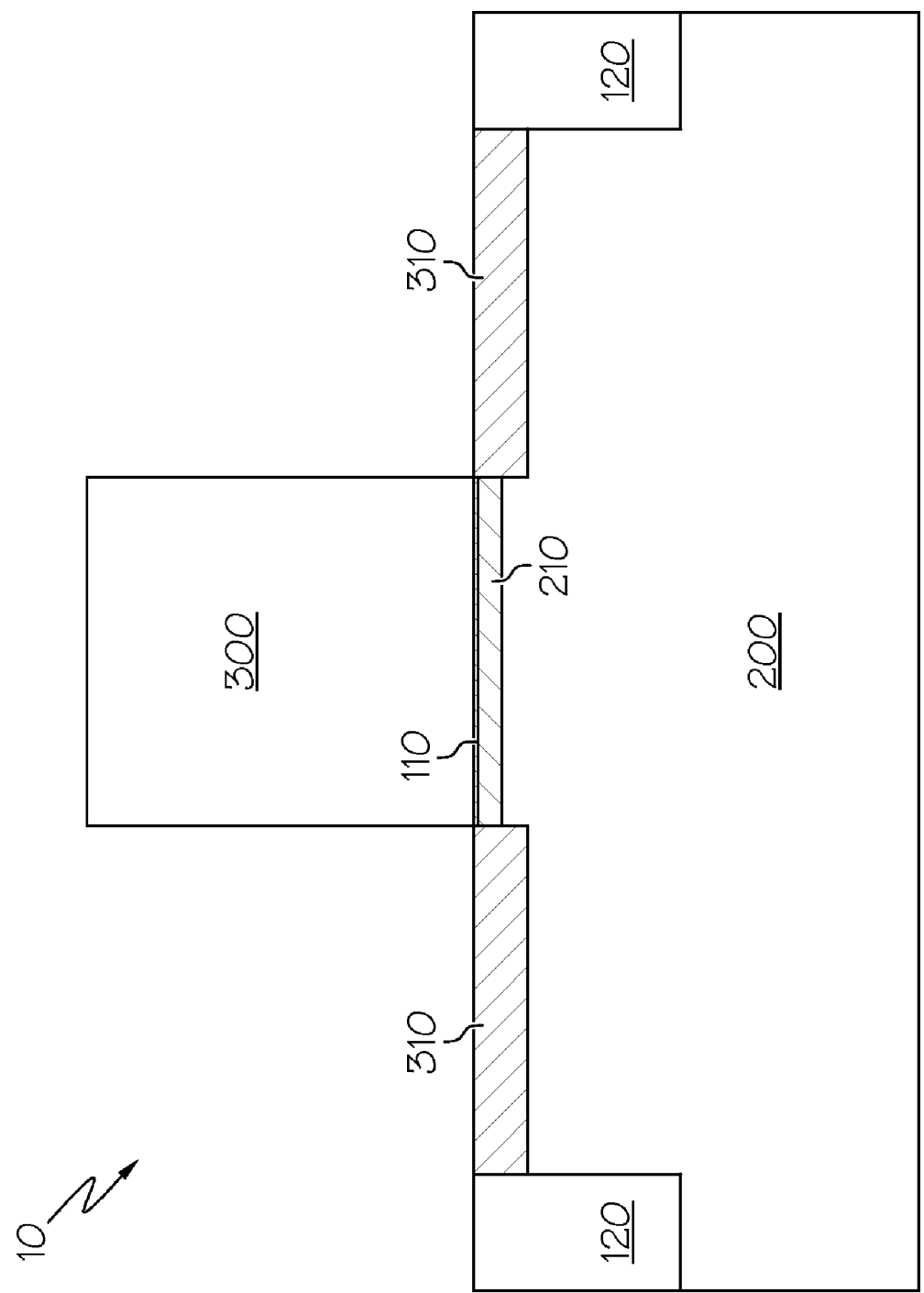

FIGS. 1a-1m illustrate the formation of a self-aligned GaAs MOSFET device 10 with high-k gate dielectrics using damascene gate methods in a stepwise fashion. Referring to FIG. 1a, a substrate 100 of bulk undoped <100> orientated GaAs wafer is generally provided. A sacrificial oxide layer 110, comprising, for example, $SiO_2$ or any other suitable sacrificial material, can be deposited over the substrate 100 using conventional deposition methods such as, for example, low pressure chemical vapor deposition (LPCVD). The thickness of the sacrificial oxide layer 110 may vary but typically has a thickness of about 10 nm.

Shallow Trench Isolation (STI) regions 120 are formed in the substrate 100. The STI openings are formed by first applying a conventional resist to the exposed surface of sacrificial oxide layer 110 (not shown). Lithography creates a pattern on the resist. The resist pattern is then transferred by conventional etching processing through the sacrificial oxide layer 110 and a portion of substrate 100 so as to provide the structure shown in FIG. 1a. After the trenches are formed in the sacrificial oxide layer 110 and the substrate 100, the trenches are filled with dielectric material such as, for example, high-density plasma oxide or TEOS (tetraethylorthosilicate). In one embodiment, the STI regions 120 are formed using liquid phase chemical enhanced oxidation. In another embodiment, the STI regions 120 are formed using oxygen implantation followed by activation annealing at 450° C. in a helium gas ambient. Although only two STI regions 120 are illustrated, any number of STI regions 120 may be formed in the substrate 100.

Turning to FIG. 1b, deep P-well 200 implantation can be made into the substrate 100 followed by shallow n-channel 210 implantation for enhancement-mode devices 10 (See FIG. 1m) and depletion-mode devices 10 utilizing conventional methods well known in the art. The implantations are then annealed at 900° C. for 5 seconds in nitrogen gas. As shown in, FIG. 1c, a dummy gate 300 is formed over the sacrificial oxide layer 110. The dummy gate 300 is comprised of sacrificial polysilicon or any other suitable related material. The dummy gate 300 may be formed using conventional deposition processes such as, for example, CVD, plasma-assisted CVD and sputtering, or LPCVD. Dummy gate 300 is patterned by lithography and etching. Although, the formation of only one dummy gate 300 is illustrated, it should be noted that any number of dummy gates 300 can be formed on the surface of the substrate 100 to create a plurality of MOSFET devices 10.

Figure 1D:
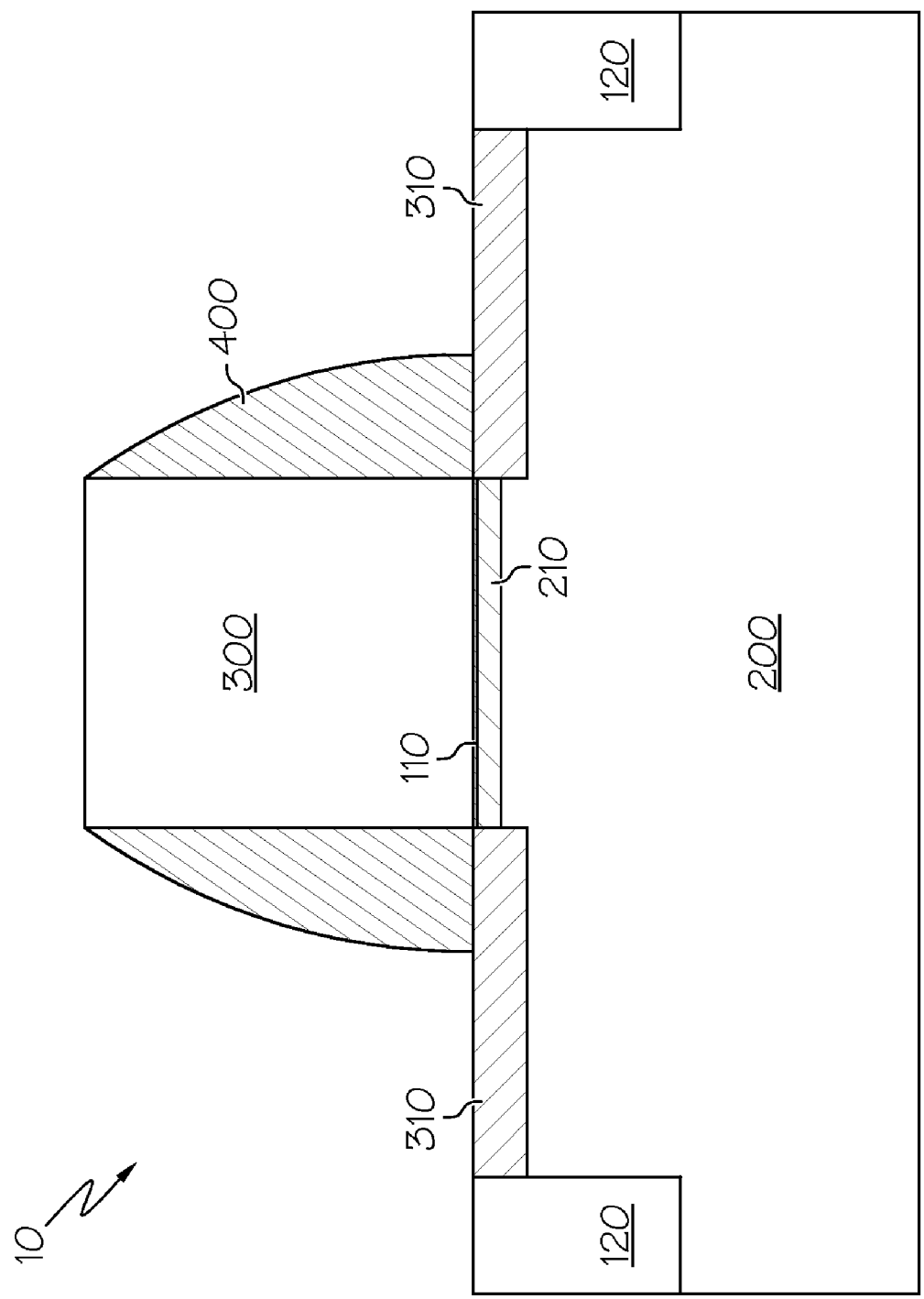

Silicon source/drain extensions 310 are then implanted in the substrate 100. The source/drain extensions 310 may be formed utilizing conventional ion implantation and annealing techniques that are well known in the art. As shown in FIG. 1d, dummy oxide spacers 400 are formed along the sidewalls of the dummy gate 300 and over portion of the source/drain extensions 310. The dummy oxide spacers 400 are formed utilizing conventional deposition processes that are well known in the art.

Figure 1E:
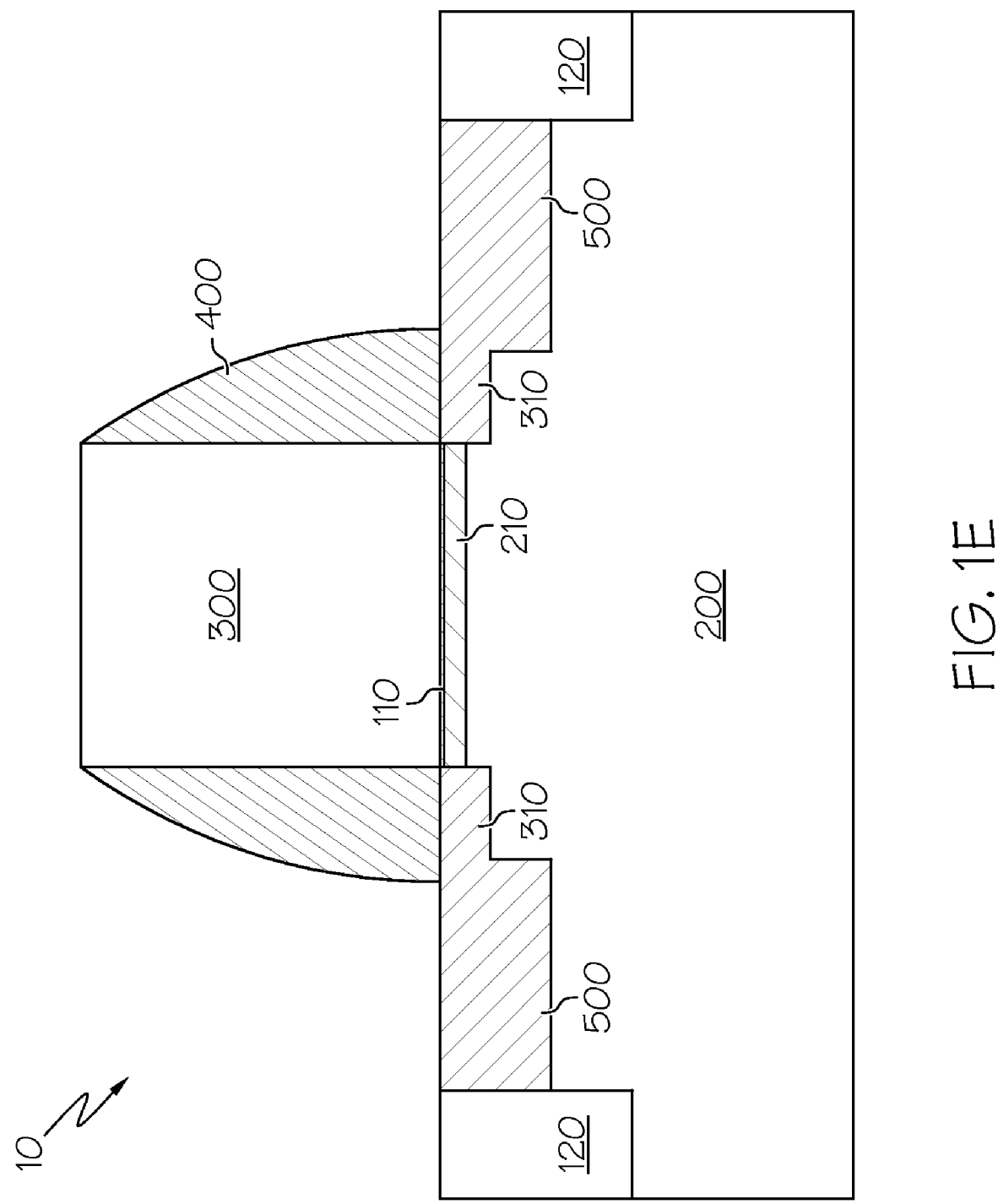
Figure 1F:
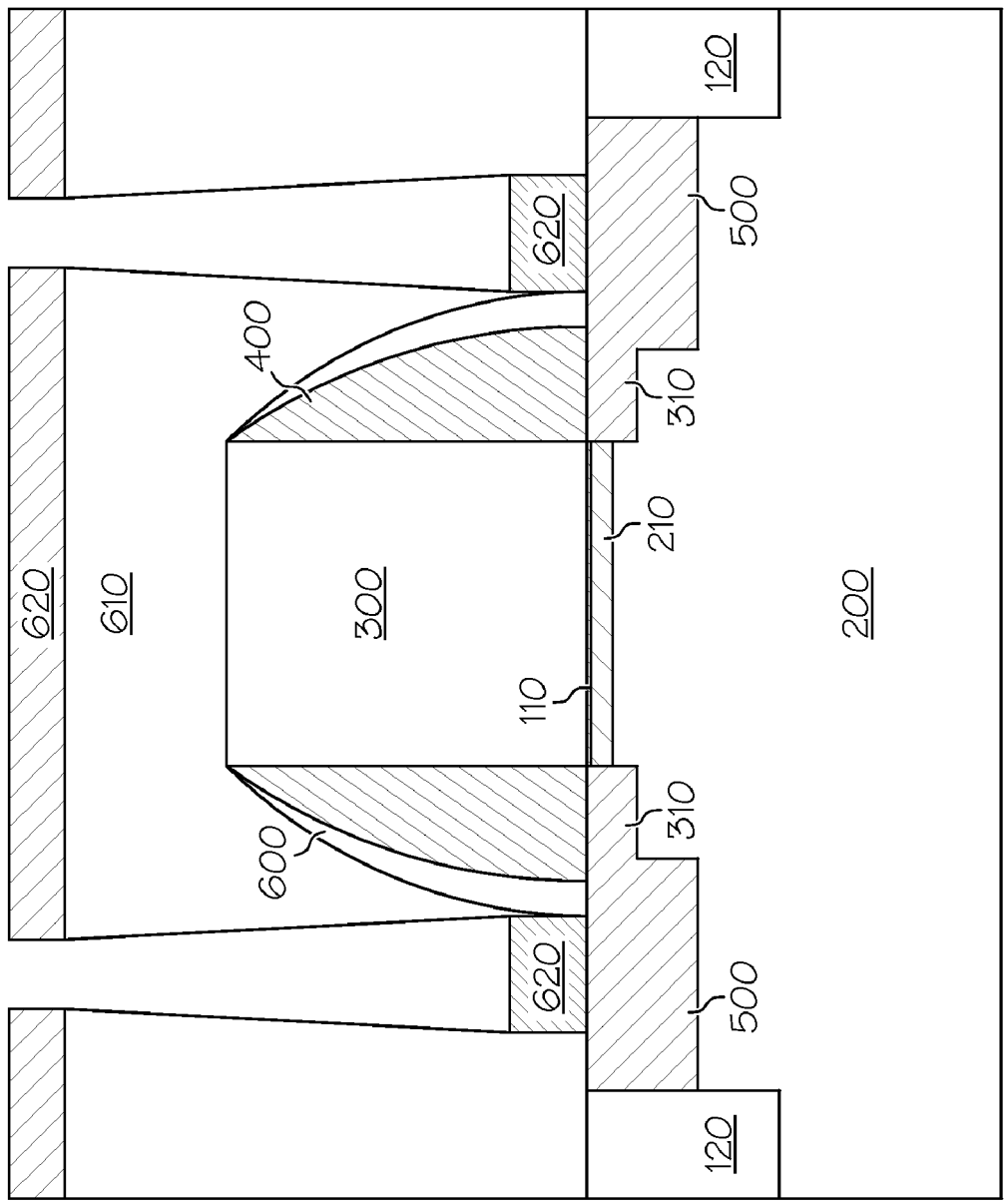
Figure 1G:
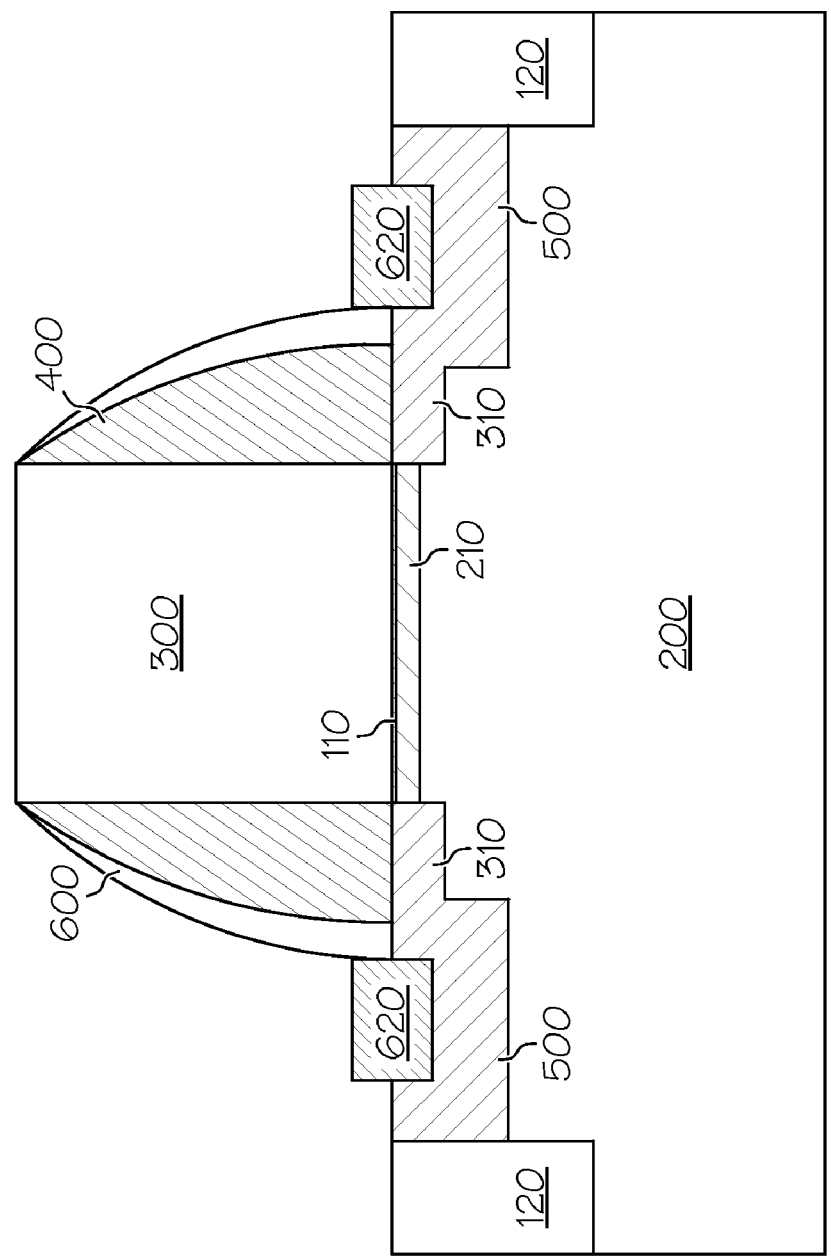

As shown in FIG. 1e, the silicon source and drain 500 are implanted using silicon ion (Si+) implantation and are annealed at 1000° C. for 5 seconds in nitrogen gas. In FIG. 1f, insulating spacers 600 are formed on the sidewalls of the dummy oxide spacers 400. The insulating spacers 600 may comprise nitride, oxynitride or a combination thereof. The source and drain regions 500 are defined by a photoresist layer 610. A layer 620 is formed by evaporating gold germanium (AuGe) to a thickness of approximately 50 nm, followed by evaporating nickel to a thickness of approximately 25 nm, which in turn is followed by evaporating gold over the device 10 to a thickness of approximately 200 nm. The photoresist layer 610 and the metals in layer 620 are lifted off by conventional methods known in the art to yield source/drain contact pads 620 as shown in FIG. 1g. The device 10 is annealed in nitrogen at 400° C. for sixty seconds to form the source/drain ohmic AuGeNiAu alloy contacts 620.

Figure 1H:
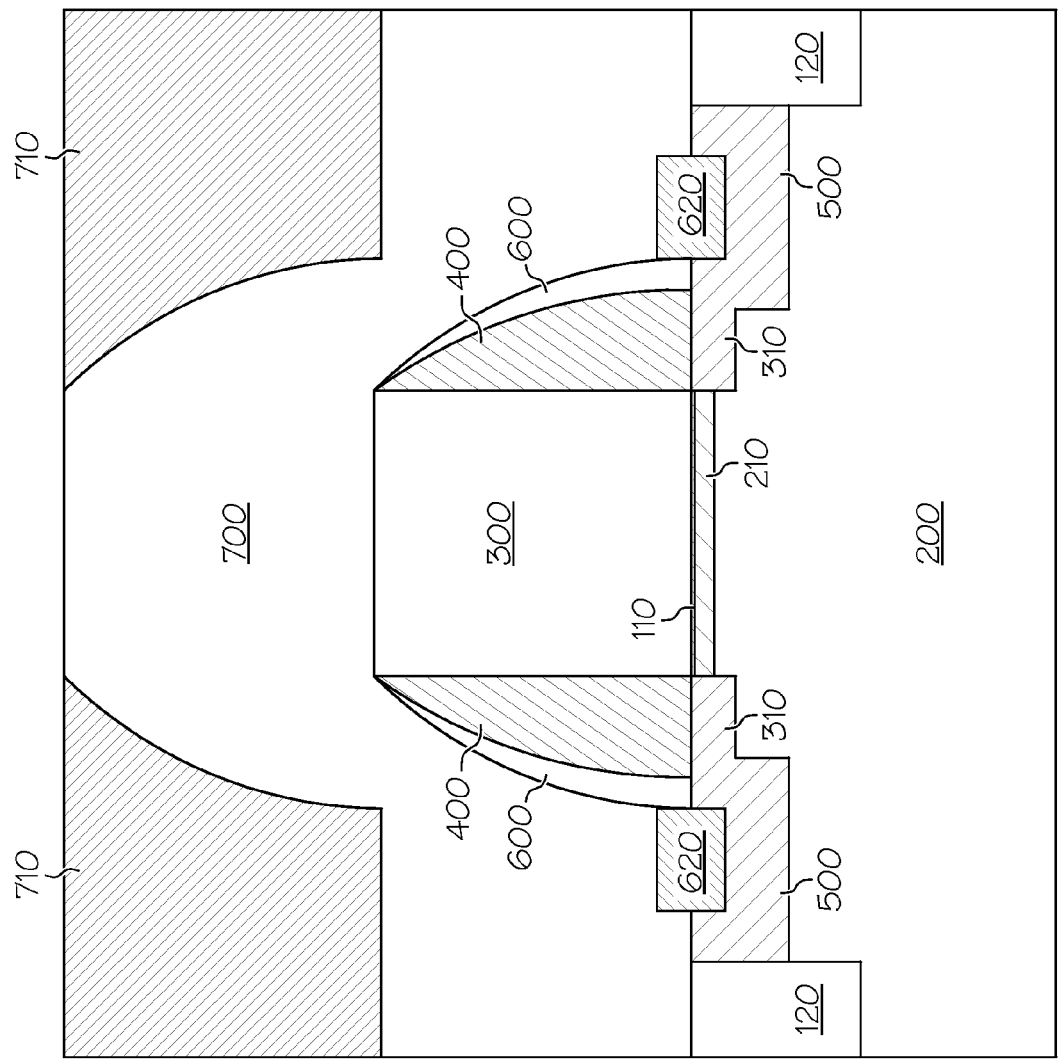
Figure 11:
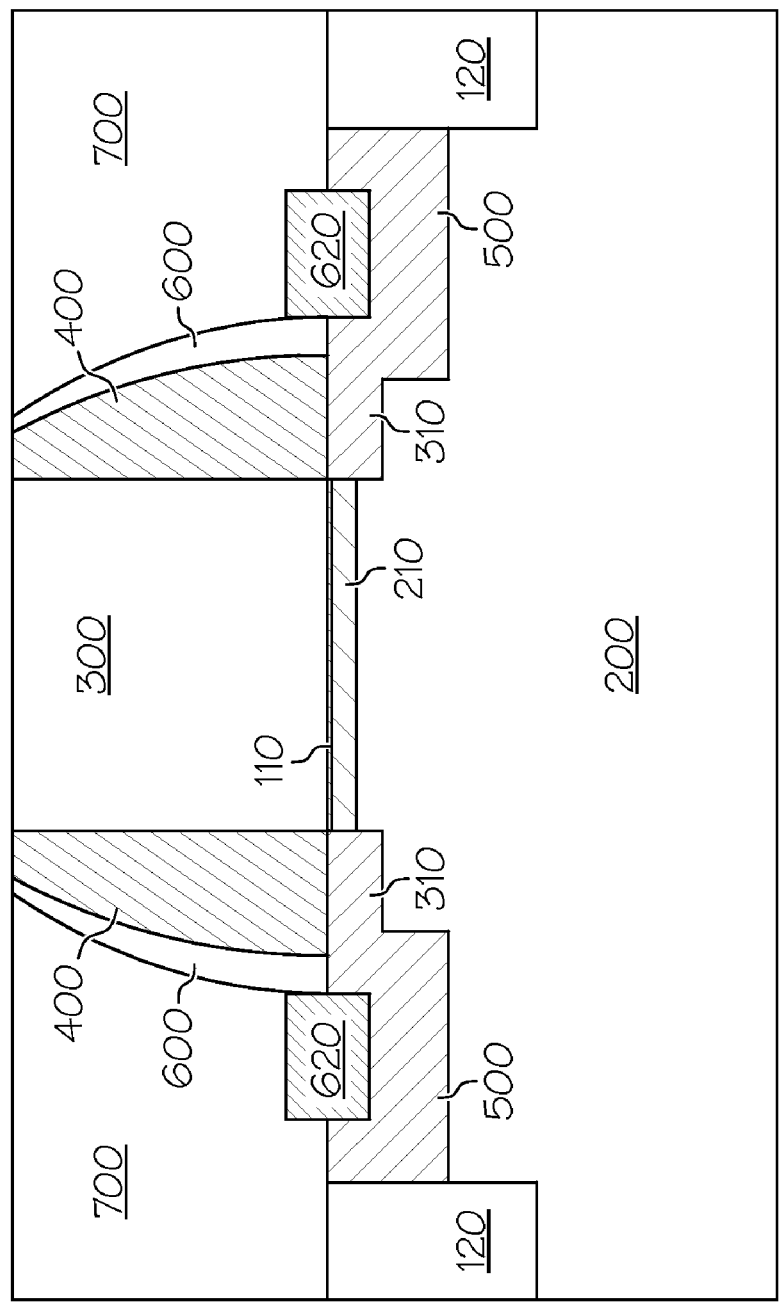

As shown in FIG. 1h, a nitride overlayer 700 is deposited over the device 10. An oxide layer 710 is then deposited on the nitride layer 700, and the oxide layer 710 is planarized so that the uppermost surface of the oxide layer 710 is substantially co-planar to the uppermost surface of the nitride layer 700. Any conventional planarization process such as chemical-mechanical polishing or grinding may be utilized. The oxide layer 710 can be, for example, high-density plasma oxide, TEOS, or any other suitable oxide.

As shown in FIG. 1i, the oxide layer 710 and nitride layer 700 are removed by reactive ion etching (RIE) so that the uppermost surface of the nitride layer 700 is substantially co-planar to the uppermost surface of the dummy gate 300.

Figure 1J:
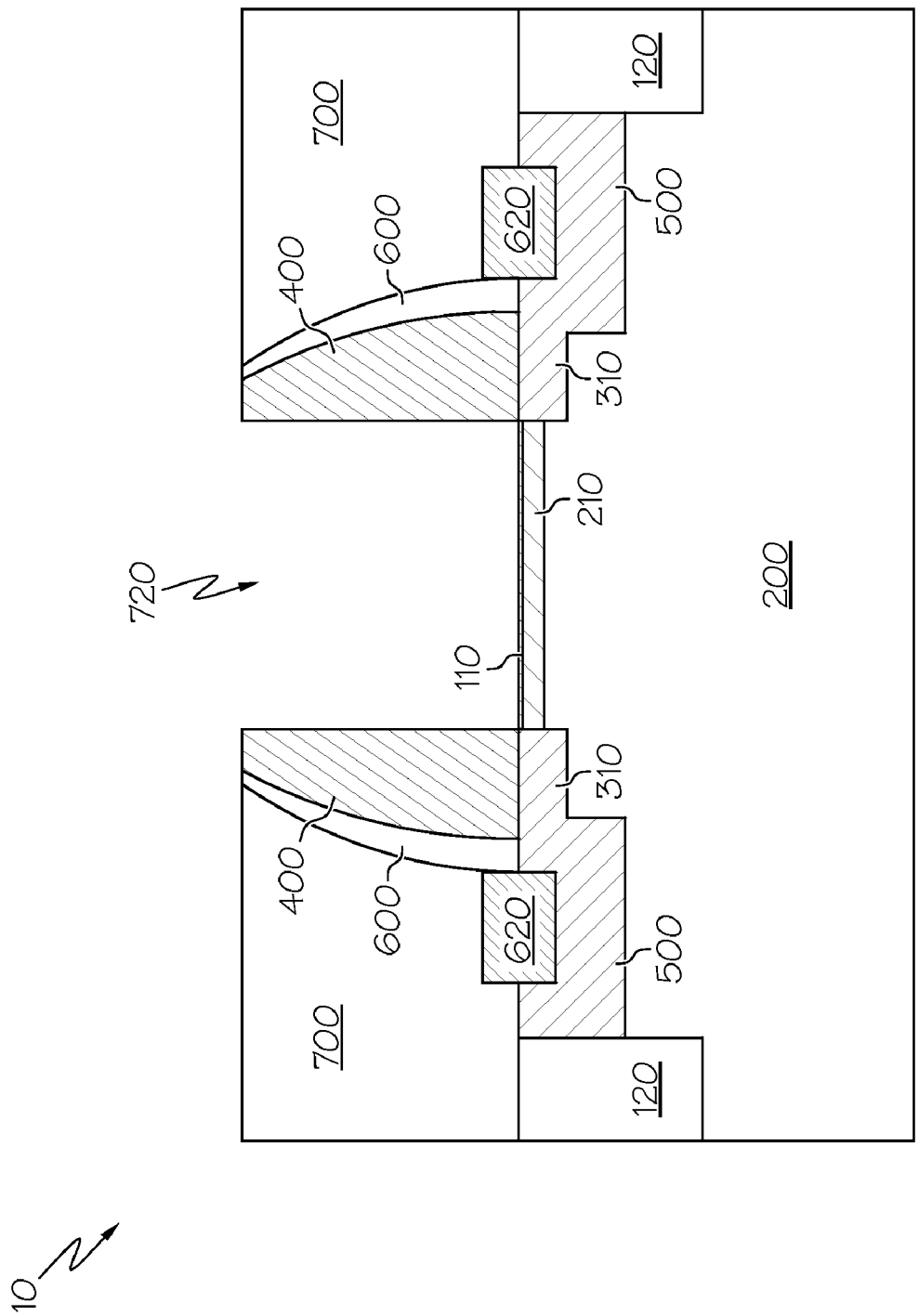
Figure 1K:
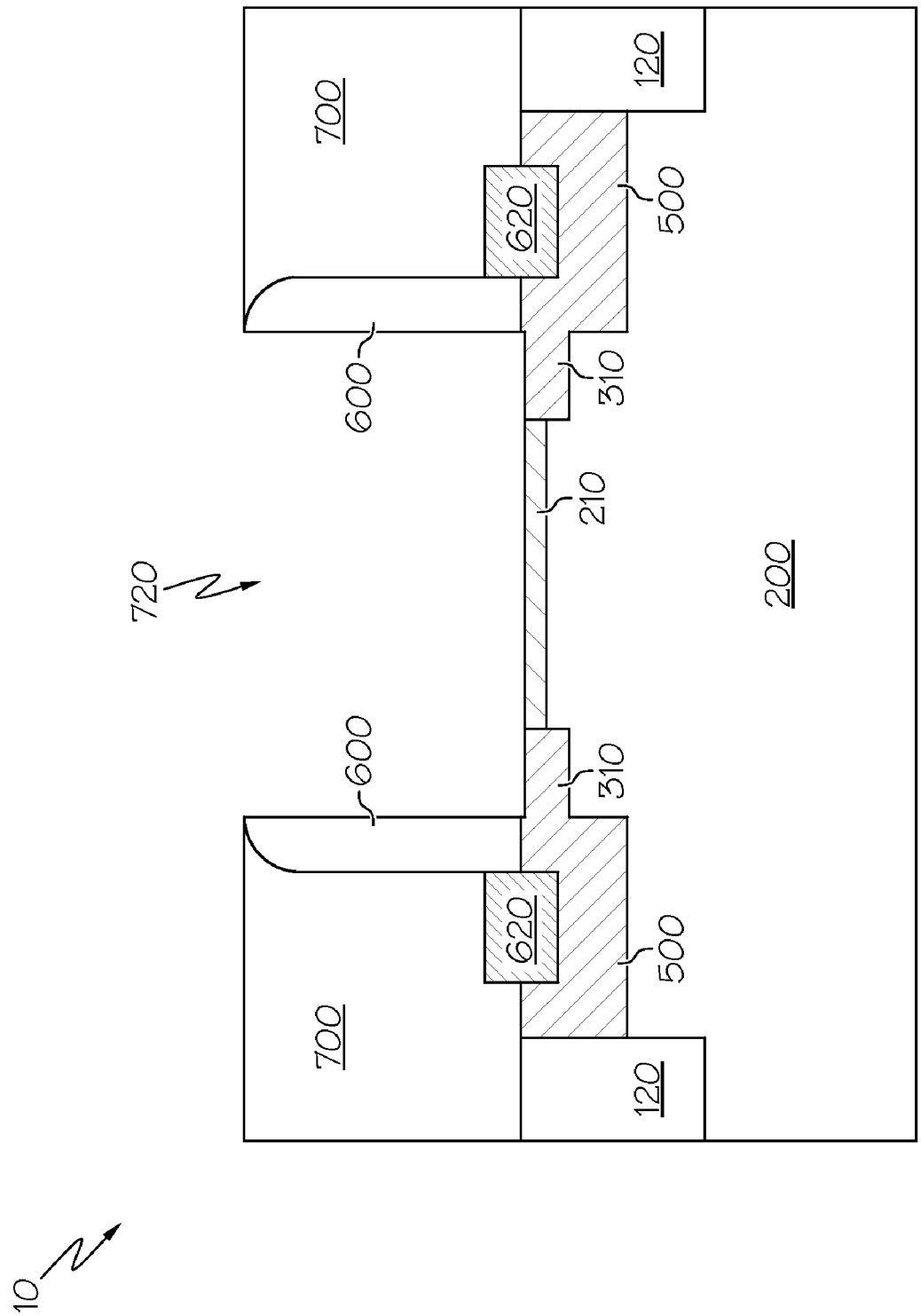

As shown in FIG. 1j, the dummy gate 300 is removed by etching utilizing RIE or a chemical down stream etching process exposing the sacrificial oxide layer 110 and resulting in the formation of gate opening 720. As shown in FIG. 1k, the dummy oxide spacer 400 and the sacrificial oxide layer 110 in the gate opening 720 are removed by etching utilizing conventional etching processing stopping on the uppermost surface of the deep P-doped well 200 of substrate 100. The innermost surface of the insulating spacers 600 define the boundaries of the gate opening 720. The source-drain extensions 310 edges are within the gate opening 720 resulting in no gap between the source-drain extensions 310 and the gate opening 720. The removal of the dummy oxide spacers 400 has allowed the resulting gate opening 720 to be made much wider for a given gate length. Additionally, the wider gate opening 720 facilitates gate formation.

Figure 1L:
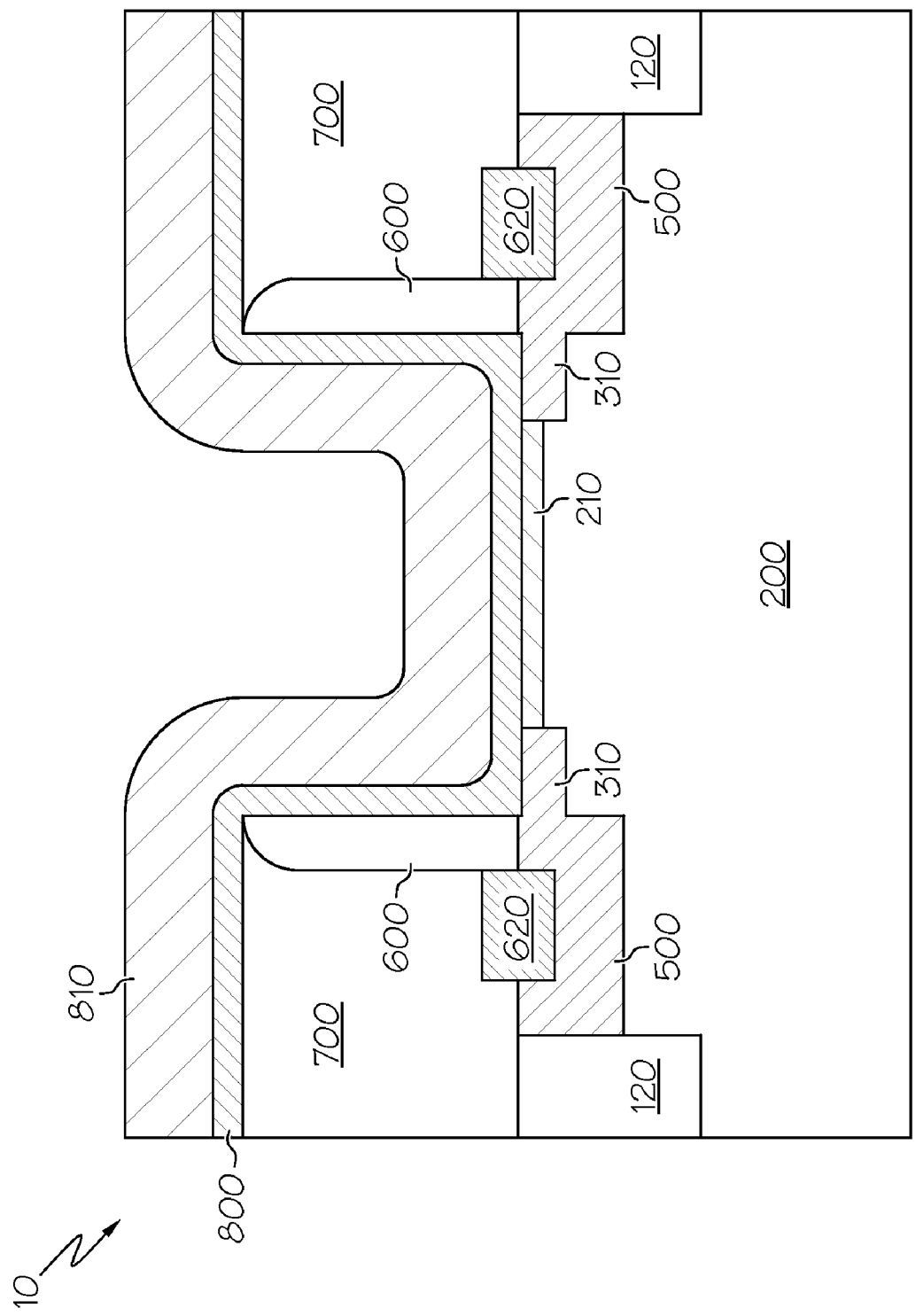
Figure 1M:
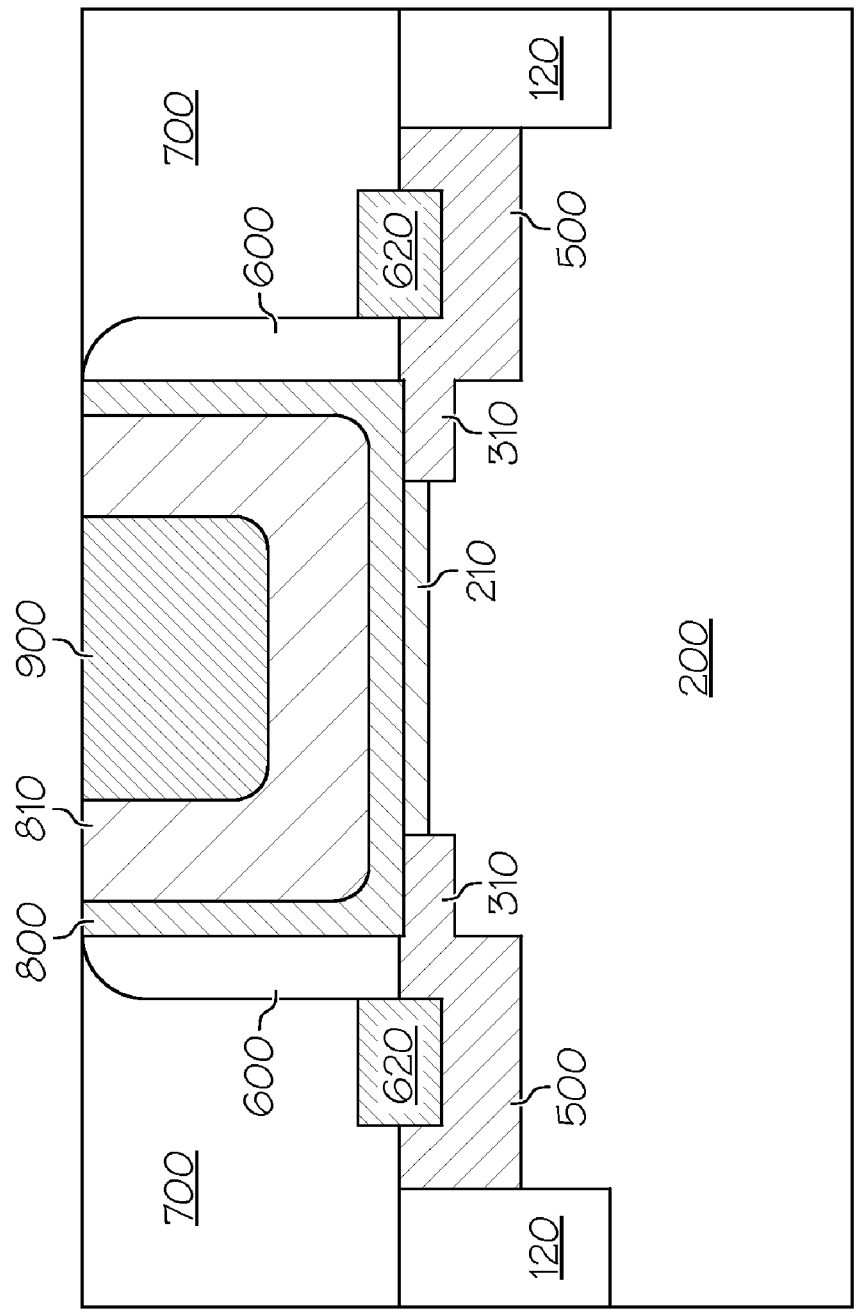

As shown in FIG. 1l, after all the front-end-of-the-line hot processes are preformed, the uppermost surface of the n-doped GaAs channel 210 within the gate opening 720 is wet cleaned. The device 10 is then loaded into an MBE (Molecular Beam Epitaxy) system and any remaining surface oxygen is removed using atomic hydrogen. The first component of the gate stack is an approximately 1.5 nm layer of amorphous silicon ($\alpha$-Si) 800 which is in-situ deposited over the device 10 and into the gate opening 720 as a passivation layer. The device 10 is then oxidized in air (i.e., native oxide) to create a layer of silicon dioxide. The layer of silicon dioxide can have a thickness of between about 0.3 nm to about 10 nm. Preferably, the layer of silicon dioxide should be less than 1 nm. An approximately 10 nm thick high dielectric constant (k) dielectric layer 810 of Hafnium oxide ($HfO_2$) is ex-situ deposited on the device 10 and into the gate opening 720 over the a-S±800 layer by atomic layer deposition (ALD) at 300° C. The device 10 is then annealed at 600° C. in nitrogen gas containing 5% oxygen. Finally, as shown in FIG. 1m, a conductive material 900 such as polysilicon, W, Ta, or TiN is then formed in the gate opening 720 over the dielectric layer 810 utilizing conventional deposition processes including, but not limited to: CVD, plasma-assisted CVD, sputtering, plating, evaporation and other like deposition processes. The structure may then be planarized by conventional planarization processes, e.g., CMP, to the uppermost surfaces of the nitride layer 700 and the insulating spacers 600.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method for fabricating a gallium arsenide MOSFET device, the method comprising:

forming a dummy gate over a gallium arsenide substrate;

implanting source-drain extensions into the substrate adjacent the dummy gate;

forming dummy oxide spacers along the sidewalls of the dummy gate and over a portion of the source-drain extensions;

implanting and annealing source-drain regions adjacent the source-drain extensions;

forming insulating spacers on the sides of the dummy oxide spacers;

defining the source-drain regions with a photoresist layer;

forming a conductive layer over the photoresist layer;
lifting off the photoresist layer and annealing the conductive layer to form contacts to the source-drain regions;
removing the dummy gate and the dummy oxide spacers to form a gate opening;
depositing in-situ a passivation layer in the gate opening;
oxidizing the surface of the passivation layer to create an oxide layer;
depositing ex-situ a dielectric layer over the oxide layer; and
depositing a gate metal over the dielectric layer to form a gate stack in the gate opening.

2. The method of claim 1, further comprising:
depositing a sacrificial oxide layer on the substrate;
forming shallow trench isolations regions in the substrate;
implanting deep p-wells into the substrate; and
implanting and annealing shallow n-channels after the deep p-well implants before the formation of the dummy gate over the substrate.

3. The method of claim 1, wherein the source-drain regions are annealed at about 1000° C. for 5 seconds in nitrogen gas.

4. The method of claim 1, wherein the conductive layer is formed by evaporating a layer of gold geranium over the photoresist layer and the source-drain regions, evaporating a layer of nickel over the layer of gold geranium and evaporating a layer of gold over the layer of nickel.

5. The method of claim 4, wherein the layer of gold geranium is about 50 nm thick.

6. The method of claim 4, wherein the layer of nickel is about 25 nm thick.

7. The method of claim 4, wherein the layer of gold is about 100 nm thick.

8. The method of claim 4, wherein the layer of gold geranium, the layer of nickel and the layer of gold are annealed in nitrogen gas at about 400° C. for about 60 seconds.

9. The method of claim 1, further comprising:
depositing a layer of nitride after forming the contacts to the source-drain regions;
depositing a layer of oxide over the layer of nitride and planarizing the oxide layer to the uppermost surface of the layer of nitride; and
etching the layer of oxide and layer of nitride to the uppermost surface of the dummy gate.

10. The method of claim 9, wherein the layer of oxide and the layer of nitride are reactively ion etched.

11. The method of claim 1, further comprises:
wet cleaning the surface of the substrate after removing the dummy gate and the dummy oxide spacer; and
removing surface oxygen by exposing the substrate to atomic hydrogen.

12. The method of claim 1, wherein the passivation layer comprises amorphous silicon.

13. The method of claim 12, wherein the amorphous silicon is deposited using in-situ molecular beam epitaxy.

14. The method of claim 1, wherein the passivation layer is approximately 1.5 nm thick.

15. The method of claim 1, wherein the oxide layer is oxidized in air.

16. The method of claim 1, wherein the oxide layer comprises silicon dioxide.

17. The method of claim 1, wherein the oxide layer is between about 0.3 nm to about 10 nm thick.

18. The method of claim 1, wherein the oxide layer is less than 1 nm thick.

19. The method of claim 1, wherein the dielectric layer comprises hafnium oxide.

20. The method of claim 1, wherein the dielectric layer is approximately 10 nm thick.

21. The method of claim 1, wherein the dielectric layer is deposited using atomic layer deposition at 300° C.

22. The method of claim 1, further comprising:
annealing the device at 600° C. in nitrogen gas containing 5% oxygen after depositing the dielectric layer.

23. A method for fabricating a gallium arsenide MOSFET device, the method comprising:
depositing a sacrificial oxide layer on a substrate of gallium arsenide;
forming shallow trench isolations regions in the substrate;
implanting deep p-wells into the substrate;
implanting and annealing shallow n-channels after the deep p-well implants;
forming a dummy gate over the shallow n-channel and the sacrificial oxide layer;
implanting source-drain extensions adjacent the dummy gate and the shallow trench isolation regions;
forming dummy oxide spacers along the sidewalls of the dummy gate and over a portion of the source-drain extensions;
implanting and annealing source-drain regions adjacent the source-drain extensions and the shallow trench isolation regions;
forming insulating spacers on the sides of the dummy oxide spacers;
defining the source-drain regions with a photoresist layer;
forming a conductive layer over the photoresist layer;
lifting off the photoresist layer and annealing the conductive layer over the source-drain regions to form alloy contacts to the source-drain regions;
depositing a layer of nitride;
depositing a first layer of oxide over the layer of nitride and planarizing the first oxide layer to the uppermost surface of the layer of nitride, wherein the uppermost surface of the first layer of oxide is co-planar to the uppermost surface of the layer of nitride;
etching the first layer of oxide and layer of nitride to the uppermost surface of the dummy gate;
removing the dummy gate;
removing the dummy oxide spacers and the sacrificial oxide layer;
wet cleaning the surface of the substrate;
removing surface oxygen using atomic hydrogen;
depositing in-situ a passivation layer;
oxidizing the surface of the passivation layer to create a second oxide layer;
depositing ex-situ a dielectric layer over the second oxide layer; and
depositing gate metal over the dielectric layer to form a gate stack.

24. The method of claim 23, wherein the sacrificial oxide layer is about 10 nm thick.

25. The method of claim 23, wherein the sacrificial oxide layer is deposited using low pressure chemical vapor deposition.

26. The method of claim 23, wherein the shallow trench isolations regions are formed using liquid phase chemical enhanced oxidation.

27. The method of claim 23, wherein the shallow trench isolations regions are formed using oxygen implantation following activation annealing.

28. The method of claim 27, wherein activation annealing occurs at about 450° C. in a helium gas ambient.

29. The method of claim 23, wherein the deep P-wells and shallow n-channels are annealed at about 900° C. for about 5 seconds in nitrogen gas.

30. The method of claim 23, wherein the conductive layer is formed by evaporating a layer of gold geranium over the photoresist layer and the source-drain regions, evaporating a layer of nickel over the layer of gold geranium and evaporating a layer of gold over the layer of nickel.

31. The method of claim 23, wherein the gate metal is planarized to the uppermost surface of the layer of nitride.

* * * * *

UNITED STATES PATENT AND TRADEMARK OFFICE
CERTIFICATE OF CORRECTION

| | | |
|---|---|---|
| PATENT NO. | : 7,435,636 B1 | Page 1 of 1 |
| APPLICATION NO. | : 11/693380 | |
| DATED | : October 14, 2008 | |
| INVENTOR(S) | : Hussein I. Hanafi | |

It is certified that error appears in the above-identified patent and that said Letters Patent is hereby corrected as shown below:

Column 5, line 23, replace "geranium" with --germanium--.

Column 5, line 25, replace "geranium" with --germanium--.

Column 5, lines 27/28, replace "geranium" with --germanium--.

Column 5, lines 33/34, replace "geranium" with --germanium--.

Column 7, line 5, replace "geranium" with --germanium--.

Column 8, line 1, replace "geranium" with --germanium--.

Signed and Sealed this
Eighth Day of February, 2011

David J. Kappos
*Director of the United States Patent and Trademark Office*